United States Patent
Chan

[19]
[11] Patent Number: 5,889,936
[45] Date of Patent: Mar. 30, 1999

[54] HIGH SPEED ASYNCHRONOUS DIGITAL TESTING MODULE

[75] Inventor: Eric Chan, San Jose, Calif.

[73] Assignee: Cypress Semiconductor Corporation, San Jose, Calif.

[21] Appl. No.: 561,886

[22] Filed: Nov. 22, 1995

[51] Int. Cl.$^6$ .................................................. G06F 11/08
[52] U.S. Cl. ................................. 395/183.15; 371/27.1
[58] Field of Search ........................ 395/183.15, 183.16, 395/183.17, 183.04; 371/22.1, 22.2, 24, 25.1, 27, 27.1

[56] References Cited

U.S. PATENT DOCUMENTS

| | | | |
|---|---|---|---|
| Re. 32,326 | 1/1987 | Nagel et al. | |
| 4,496,985 | 1/1985 | Jansen et al. | |
| 4,807,147 | 2/1989 | Halbert et al. | 364/487 |
| 4,823,363 | 4/1989 | Yoshida | |
| 5,289,116 | 2/1994 | Kurita et al. | |
| 5,295,079 | 3/1994 | Weng et al. | |
| 5,345,109 | 9/1994 | Mehta | |
| 5,490,282 | 2/1996 | Dreps et al. | 295/821 |
| 5,524,114 | 6/1996 | Peng | 371/22.1 |
| 5,528,136 | 6/1996 | Rogoff et al. | 324/158.1 |
| 5,543,707 | 8/1996 | Yoneyama et al. | 324/115 |
| 5,598,156 | 1/1997 | Hush et al. | 341/100 |
| 5,614,838 | 3/1997 | Jaber et al. | 324/765 |
| 5,633,899 | 5/1997 | Fiedler et al. | 375/376 |
| 5,740,086 | 4/1998 | Komoto | 364/580 |

*Primary Examiner*—Albert DeCady
*Attorney, Agent, or Firm*—Blakely Sokoloff, Taylor & Zafman, LLP

[57] ABSTRACT

A high speed digital tester module for functionally testing integrated circuits while operating at very fast speeds or under real time conditions. The high speed digital tester captures data streams from the integrated circuit at a first frequency and inputs the data into a memory device at a second frequency, which is slower than the first frequency. The digital tester module comprises a phase locked-loop, a serial-to-parallel converter and an output memory device. The phase locked-loop captures the data stream from the integrated circuit and generates two clock signals, a bit-rate clock signal and a divide-by-N-clock signal. The parallel-to-serial converter clocks in the data stream in response to the bit-rate clock signal and converts the data stream into parallel data. The output memory device clocks in the parallel data in response to the divide-by-N clock signal. The parallel data is stored in the output memory device until it is accessed by a processor which determines whether the integrated circuit is functional.

42 Claims, 7 Drawing Sheets

|     | Marker Field | Output Vector Field | 700 |
|-----|--------------|---------------------|-----|
| 1   | 111          |                     |     |
| 2   |              |                     |     |
|     | ⋮            | ⋮                   |     |
| 10  |              | 0101010101          |     |
| 11  | 101          |                     |     |
|     | ⋮            | ⋮                   |     |
| 20  |              | 0000000000          |     |
| n   |              |                     |     |

Fig. 7

HIGH SPEED ASYNCHRONOUS DIGITAL TESTING MODULE

BACKGROUND OF THE INVENTION

1. Field of the Invention

The present invention relates to the field of digital testers. More specifically, the present invention relates to digital testers that perform high speed functional testing of an integrated circuit or a system.

2. Background Information

Conventional digital testers functionally test high speed integrated circuits by inputting a sequence of test vectors into the integrated circuit, performing a series of test operations on the integrated circuit, and then evaluating a sequence of output test vectors to determine if the integrated circuit is generating the correct data for each test operation. Conventional digital testers include testers such as integrated circuit testers, system testers, logic analyzers and circuit emulators. However, as integrated circuits are designed to operate at faster speeds, the conventional digital testers do not have the capability to capture high frequency data streams, also known as output test vectors, from the integrated circuits operating under real time test conditions. As such, the functionality of an integrated circuit is tested at frequencies slower than the actual operating frequency of the device when operating under normal conditions and the real time performance of an integrated circuit is not tested. Conventional digital testers such as the Cadence LT-1001, the Synopsis LM-1400, the Synopsis MS-3400 and the Phillips PM-3580 are not able to functionally test an integrated circuit operating at a speed faster than 100 Megahertz (MHz). However, the present invention has the capability to capture output test vectors having a frequency beyond 100 MHz and thus the ability to perform real time functional testing on integrated circuits operating over an increased range of frequencies. The present invention has the capability to capture data streams up to 1 Gigahertz (GHz).

Furthermore, the conventional digital testers have a complicated control and clock distribution system that is associated with the interleaving of memory devices used for storing the input and output test vectors. FIG. 1 illustrates a device under test 160 that is coupled to a conventional digital tester 100. The conventional digital tester 100 stores the output test vectors in a memory device 120 such as a dynamic random access memory (DRAM) or a static random access memory (SRAM). In order to improve the access time to and from the memory device 120, several banks of memory are interleaved requiring a complicated control logic and clock distribution scheme.

The following example illustrates some of the complexities involved in designing a clock distribution scheme for an interleaved memory device. The clock distribution scheme can be designed to provide a single high frequency (F) clock or as N different clocks of frequency F/N, where N represents the number of banks of the interleaved memory devices. If a single high frequency clock is used, the transmission line effect on clock line 140 will be severe. If multiple clocks of lower frequencies are used, additional circuits for stabilizing the relative skew of the various clock lines must be provided. In both of the cases mentioned above, the distribution of the clock throughout all of the interleaved memory devices is more complex than in the present invention. The simplicity of the control and clock distribution scheme of the present invention will be apparent from the detailed description below.

Another drawback with many of the conventional digital testers is that they require an external clock signal that is centered at the middle of the data period. Thus, in addition to receiving the output test vectors over data line 130, the tester 110 requires an external clock signal over clock line 140. This drawback precludes the conventional digital tester from testing serial data communication chips that do not generate an external clock signal. The present invention eliminates the need for an external clock signal from the device under test, and therefore has the ability to test asynchronous outputs of a device and is extremely useful in testing data communication chips and systems.

SUMMARY OF THE INVENTION

It is desirable to provide a high speed digital tester that performs complete functional testing of an integrated circuit operating under real time operating conditions or at very fast speeds.

It is also desirable to provide a high speed digital tester that can perform functional testing on an integrated circuit having asynchronous data outputs.

Furthermore, it is desirable to simplify the control and clock distribution scheme used to store input or output test data in a memory device.

It is further desirable to couple a digital tester module with a computer system to determine whether the integrated circuit generated the correct output test data for each test procedure performed by the integrated circuit.

The present invention is a high speed digital tester module for testing the functionality of an integrated circuit. The digital tester module may be used in conjunction with a computer system or may be an enhancement to a conventional digital tester. The digital tester module includes, in one embodiment, a phase locked-loop, a serial-to-parallel converter and an output memory device.

The phase locked-loop receives a serial stream of output test data from the integrated circuit under test. By referencing the serial stream of output test data, the phase locked-loop generates two clock signals. The first clock signal represents the frequency at which the serial data is received and the second clock signal represents the frequency of the first clock signal divided down by N times, where N is the number of bits of output test data stored in each memory location in the output memory device. Thus, the phase locked-loop generates the input clock signal for both the serial-to-parallel converter and the output memory device.

The serial-to-parallel converter receives the first clock signal from the phase locked-loop and clocks the serial stream of output test data from the integrated device into the serial-to-parallel converter in response to the first clock signal. The serial-to-parallel converter converts the serial stream of output test data into parallel output test data.

The output memory device receives the second clock signal from the phase locked-loop and clocks in the parallel output test data from the serial-to-parallel converter in response to the second clock signal. The parallel output test data is stored in the output memory device until it is accessed by a processor. The processor determines whether or not the test results generated by the integrated circuit are correct.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 7 illustrates a First-In-First-Out memory device having a marker field and an output vector field in each memory location.

DETAILED DESCRIPTION

A HIGH SPEED ASYNCHRONOUS DIGITAL TESTING MODULE is disclosed. In the following description, numerous specific details are set forth such as specific circuits, devices, etc. in order to provide a thorough understanding of the present invention. It will be obvious, however, to one skilled in the art that these specific details need not be employed to practice the present invention. In other instances, the functioning of well-known circuit components, logic gates, etc., have not been described in particular detail so as not to obscure the present invention.

The present invention is a high speed digital testing module that can be used in conjunction with either a conventional digital tester or with a computer system. The present invention has the ability to test both synchronous and asynchronous signals generated by an integrated circuit or a system. Furthermore, the present invention has the ability to test real time functioning of an integrated circuit that operates in the frequency range of 100 Megahertz (MHz) to 1 Gigahertz (GHz). By slowing down the output vectors generated by the device under test before being stored in a memory device, the present invention has the capability of performing functional testing at faster speeds than required to write the output test data into the memory device. Typically, conventional digital testers store the output vectors in either static or dynamic random access memory (SRAM or DRAM) devices such that the device under test may be tested only as fast as the output test data can be written into or read from the memory device. Therefore, the functional testing of an integrated circuit by a conventional digital tester is limited to the speed at which the memory devices can be accessed.

In one embodiment of the present invention, the device under test performs functional testing at a speed of 155 MHz and writes into the memory device at approximately 15.5 MHz. In this example, the output memory device is accessed at one tenth the frequency in which output test data is sampled from the integrated circuit. On the other hand, if a conventional digital tester is used to test the device, the functional testing of the device is limited to 20 MHz, which is the speed at which the output vectors can be written into the output memory device.

Figure 1:
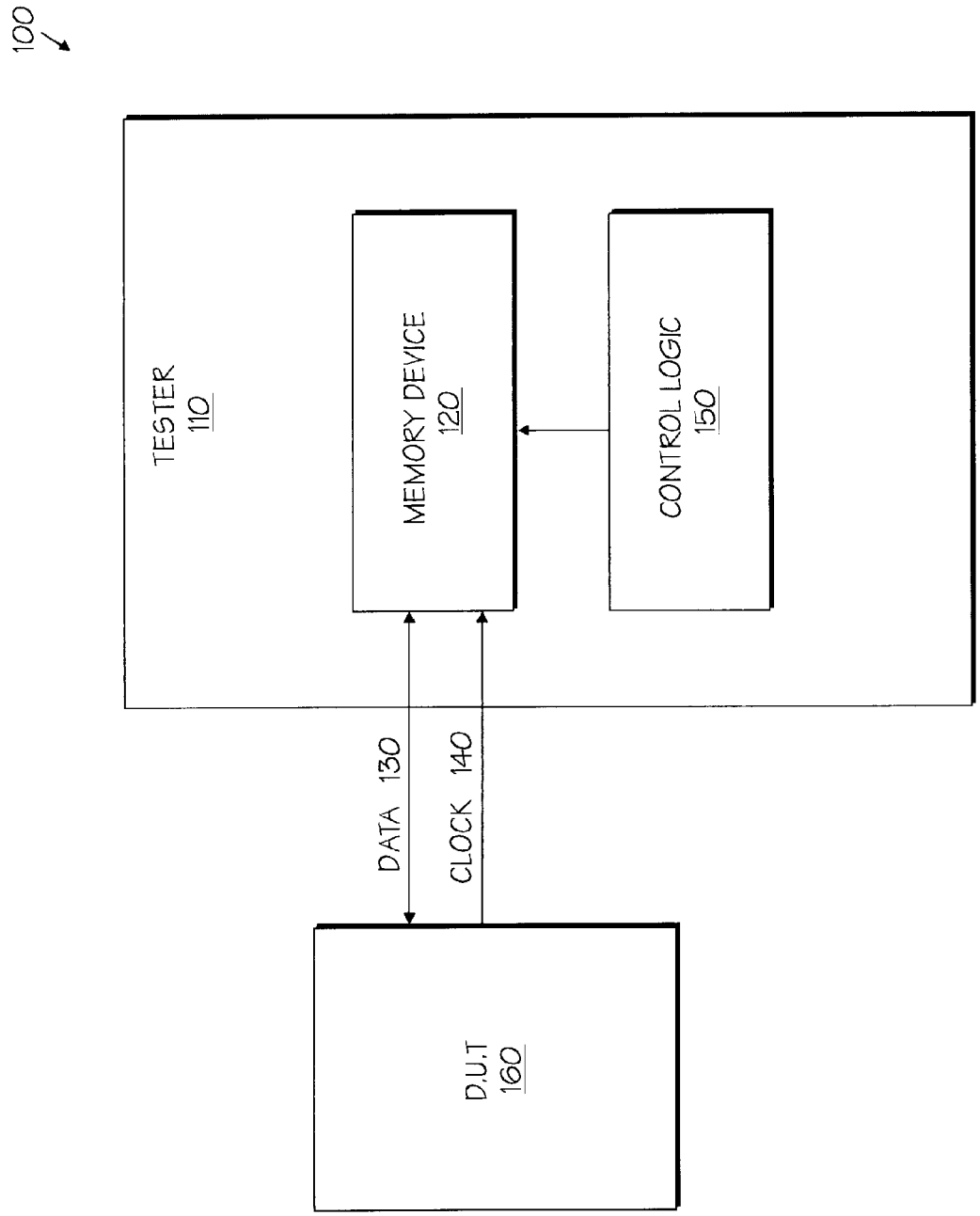
FIG. 1 illustrates a conventional digital tester in the prior art.
Figure 2:
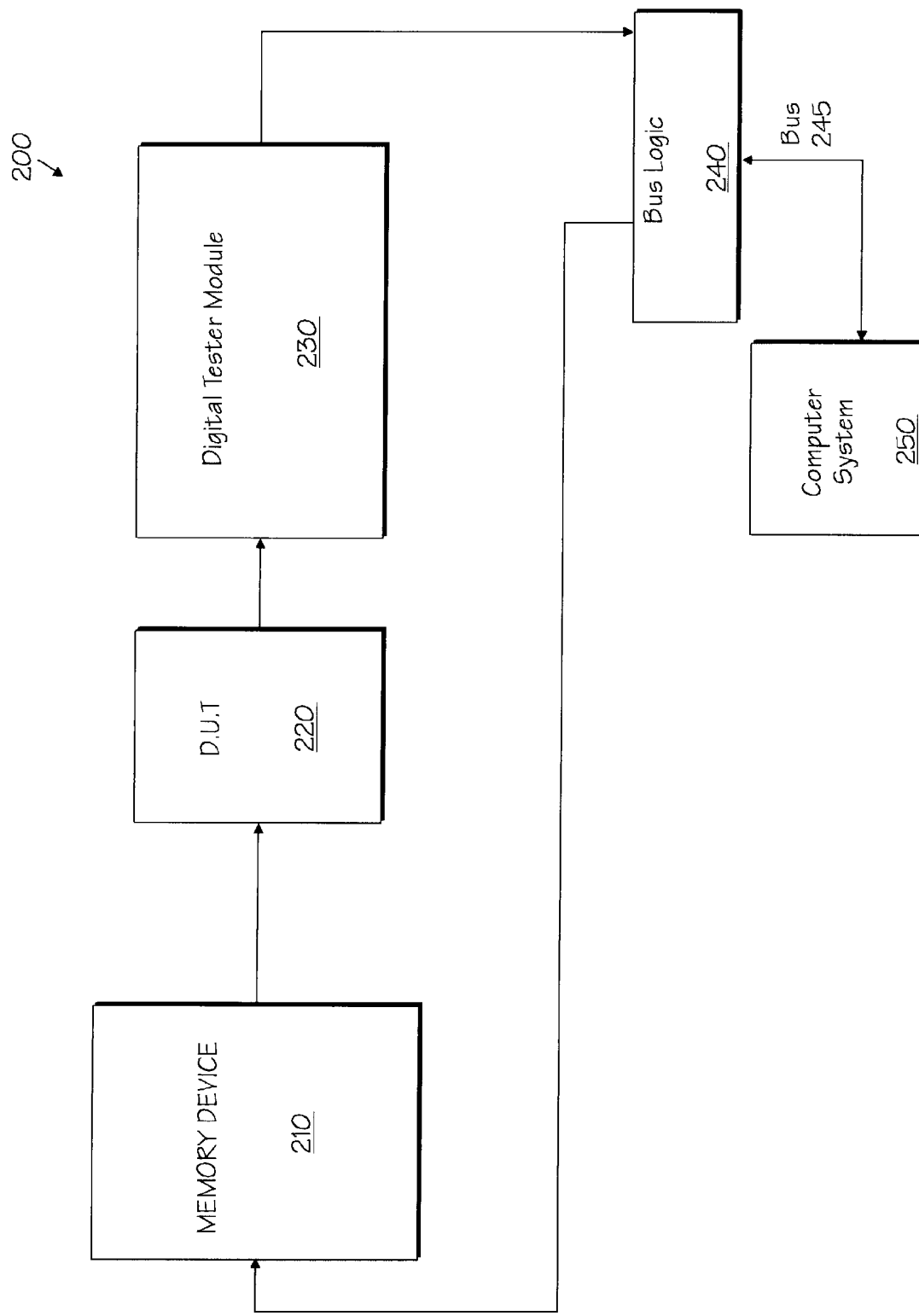
FIG. 2 illustrates a high speed digital tester that operates with a computer system.

FIG. 2 illustrates a high speed digital tester module coupled to a Computer System 250. The Computer System 250 is a digital computer comprising a central processing (CPU), memory devices including Random Access Memory (RAM) and Read Only Memory (ROM), a mass storage device, a display device, an alpha-numeric input device, and a cursor control. The Computer System 250 is coupled to memory device 210 via bus 245 where the bus logic 240 controls access to bus 245.

In one embodiment of the present invention the Computer System 250 is coupled to memory device 210 via an ISA bus operating at 8 MHz. The Computer System 250 generates input test data which is stored in the memory device 210 until loaded into the device under test 220. The device under test 220 performs one or more test procedures to test the functionality of device 220 and generates output test data. A test procedure may include many steps such as in arithmetic functions like multiplication or addition where multiple states are involved.

The device under test 220 is coupled to the digital tester module 230 such that the output test vectors generated by the device 220 are captured and stored in the digital tester module 230. The Computer System 250, coupled to the digital tester module 230, accesses the output test data from the digital tester module 230. The Computer System 250 determines whether the device 220 generated the correct output test data for each test procedure performed. Thus, the device 220 has the ability to perform functional testing in real time of a device operating over 100 MHz, as compared with many of the conventional digital testers which are limited to the access time of the data stored in the device under test 230.

Figure 3:
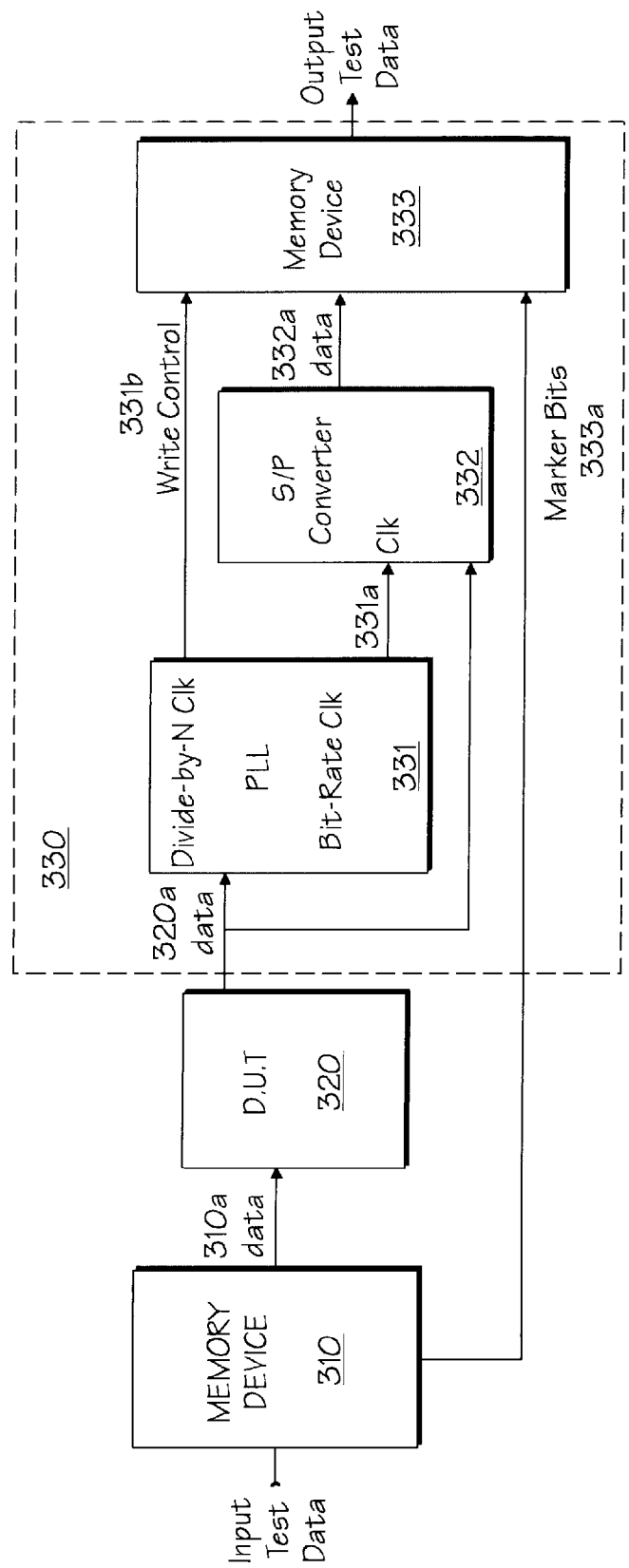
FIG. 3 illustrates an embodiment of the digital tester module.

FIG. 3 is a detailed block diagram of a digital tester module 330. The digital tester module 330 includes a phase locked-loop 331, a serial-to-parallel converter 332, and an output memory device 333. In this particular embodiment the output memory device 333 is a FIFO memory device. In an alternative embodiment the output memory device 333 is a DRAM device having control logic to control the first-in-first-out order in which data is written into or read from the DRAM device.

According to FIG. 3, the phase locked-loop 331 receives a serial stream of output data from the device under test 320, which may be an integrated circuit (IC) or a system containing many ICs, over data line 320a. The phase locked-loop samples the serial stream of output test data from the device under test 320 and determines the frequency at which the serial stream of output test data is received. In response to the serial stream of output test data, the phase locked-loop 331 generates two clock signals. The first clock signal has a frequency representing the rate at which the serial stream of output data is received from the device 320, and the second clock signal has a frequency representing a fraction of the frequency of the first clock signal. In other words, the second clock signal is the first clock signal divided by N, where N represents the number of bits per word stored in each location of the memory device 333.

The serial-to-parallel converter 332 also receives the serial stream of output test data from the device 320 via data line 320a. The serial stream of output test data from the device 320 is clocked into the serial-to-parallel converter 332 in response to the first clock signal, also referred to as the bit-rate clock signal and is received by the serial-to-parallel converter 332 via line 331a. The serial-to-parallel converter 332 shifts in the serial stream of output data received over line 320a and converts the serial stream of output data into parallel output data that is outputted over data line 332a.

The memory device 333 receives the second clock signal, also referred to as the divide-by-N clock signal, from the phase locked-loop 331 over write control line 331b. In response to the second clock signal, memory device 333 inputs parallel output data over line 332a into memory device 333. The parallel output test data is stored in memory device 333 on a first-in first-out basis, such that the first word written into the memory device 333 is the first word read from the memory device 333. Thus, the serial stream of output test data generated by the device 320 is received by the phase locked-loop 331 at a first frequency, and the parallel output data frequency is received by the memory device 333 at a second frequency where the second frequency is slower than the first frequency.

In one embodiment of the present invention the device 320 receives input test data at a frequency of 20 MHz and performs functional testing of the device 320 at a frequency of approximately 155 MHz. The serial stream of output test data generated by the device 320 is sampled by the phase locked-loop 331 at 155 MHz and is eventually written in the memory device 333 at approximately 15.5 MHz. This particular example illustrates that the memory device 333 receives data at a frequency that is one tenth of the frequency of the output data sampled.

Still referring to FIG. 3, the memory device 310 is coupled to the memory device 333 such that the marker bits stored in the memory device 310 are received by the memory device 333. In an alternative embodiment, the marker bits may be provided from some other external source. The serial stream of output test data includes a plurality of output test vectors where each output test vector has a corresponding input test vector. These marker bits are useful for "time stamping" the output test vectors captured by the digital tester module 330. The marker bits specify that a particular output test vector indicates the beginning of a sequence of output test vectors for a particular test procedure performed by the device 320. This type of marking is often necessary when the high speed signals that provide the output test data are asynchronous to the other signals of the device under test. Thus, the marker bits are used as clues to realign the input test vectors with the output test vectors in order to reflect their true phase and frequency relationship during the testing of an integrated circuit device.

Each memory location in memory device 333 includes both a marker field for storing marker bits and an output vector field for storing output test vectors. In one particular embodiment of the present invention, each of the output vector field stores 10 bits of parallel output test data and each of the marker fields stores 3 bits of marker data also referred to as a marker group. The marker bits specify that a particular output test vector indicates the beginning of a sequence of output test vectors for a particular test procedure performed by the device 320. A group of marker bits (e.g. 3 bits of marker data) are received by the memory device 333 in one memory location to specify that after a predetermined latency period, due to the gate delays in the device under test and through the serial-to-parallel converter 332, the output test vector in a second memory location corresponds to the beginning of the output test data for a particular test procedure performed by the device. The marker bits and the output test data are written into the memory device 333 asynchronously. As long as each marker group is available to be written into the memory device 333 or repeated for at least one divide-by-N clock period, data will be written into the marker field and the corresponding output vector field simultaneously in response to the divide-by-N clock signal.

FIG. 7 illustrates a First-In-First-Out memory device having a marker field and an output vector field in each of the memory locations. In memory location 1 of the First-In-First-Out memory device 700, 3 bits of marker data are stored in the marker field. The marker bits "111" are supplied by the input memory device 310 in one embodiment, and in an alternative embodiment are supplied from some other external source. The marker data "111" stored in memory location 1 indicates that after a predetermined latency period the output test vector stored in the output vector field of memory location 10 corresponds to a particular test procedure performed by the device. According to FIG. 7, data "0101010101" stored in the output vector field of memory location 10 represents the beginning of a sequence of output test vectors that correspond to a test function performed by the device under test. Thus, the marker bits allows the output test data stored in the output memory device 333 to align the output test vectors with its corresponding input test vectors. Furthermore, the marker data "101" stored in memory location 11 of the output memory device 700 indicates that the output test data "0000000000" stored in the output vector field of memory location 20 represents the beginning of a second sequence of output test vectors that correspond with a second test function performed by the device under test. Thus, the processor knows that the output test data corresponding to a particular test function is received by the output memory device after a latency of 10 divided-by-N clock signals to the output memory device. As such, the output test vectors can be realigned with the input test vectors to determine whether the device under test generated the correct output test vectors after performing various functional tests.

Figure 4:
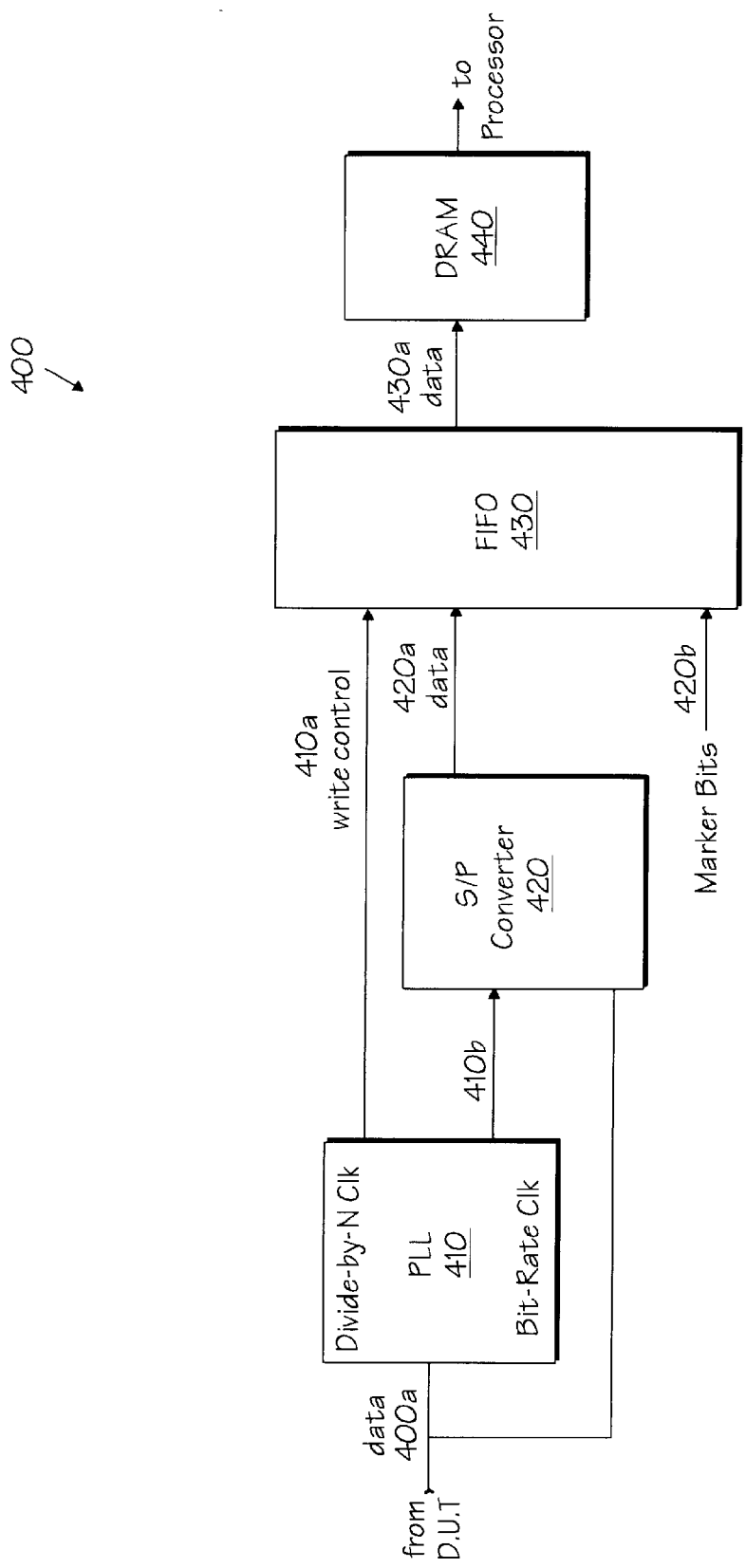
FIG. 4 illustrates another embodiment of the digital tester module.

FIG. 4 is an alternative embodiment of a digital tester module. The phase locked-loop 410 receives a serial stream of output test data from the device under test. The output test data from the device under test is supplied to the phase locked-loop and to the serial-to-parallel converter 420 over data line 400a. In response to the serial stream of output test data received by the phase locked-loop 410, the phase locked-loop 410 generates two clock signals. The first clock signal is a bit-rate clock signal that is supplied to the serial-to-parallel converter 420 over line 410b. The second clock signal is a divide-by-N clock signal that is supplied to the FIFO device 430 over write control line 410a.

The serial-to-parallel converter 420 clocks in the serial stream of output data from the device under test in response to the bit-rate clock signal and the FIFO 430 clocks in parallel data into a memory location of FIFO 430 in response to the divide-by-N clock signal over write control line 410a. The serial-to-parallel converter 420 converts 10 bits of serial data into 10 bits of parallel data such that each memory location in the FIFO 430 stores a word of output test data having 10 bits of data. Since the output memory device 430 is a First-In-First-Out memory device, the first data written into FIFO 430 is the first data that is read out of the FIFO 430. The FIFO 430 may include two 9 bit by 32,000 word deep FIFOs cascaded together to form an 18 bit wide by 32,000 deep FIFO memory device. In the embodiment shown in FIG. 4, the FIFO 430 is coupled to a dynamic random access memory device (DRAM) 440. Therefore, the capacity of the FIFO memory device 430 is augmented by the DRAM 440 such that output test data stored in FIFO 430 is supplied to DRAM 440 over data line 430a. By coupling FIFO 430 to DRAM 440, the digital tester module 400 functions as a data acquisition device. Rather than simply buffering the output test vectors in a FIFO device, a larger quantity of output vectors can be stored in the DRAM device 440. FIFO 430 may also receive marker bits over line 420b from an input memory device or some other external source.

Figure 5:
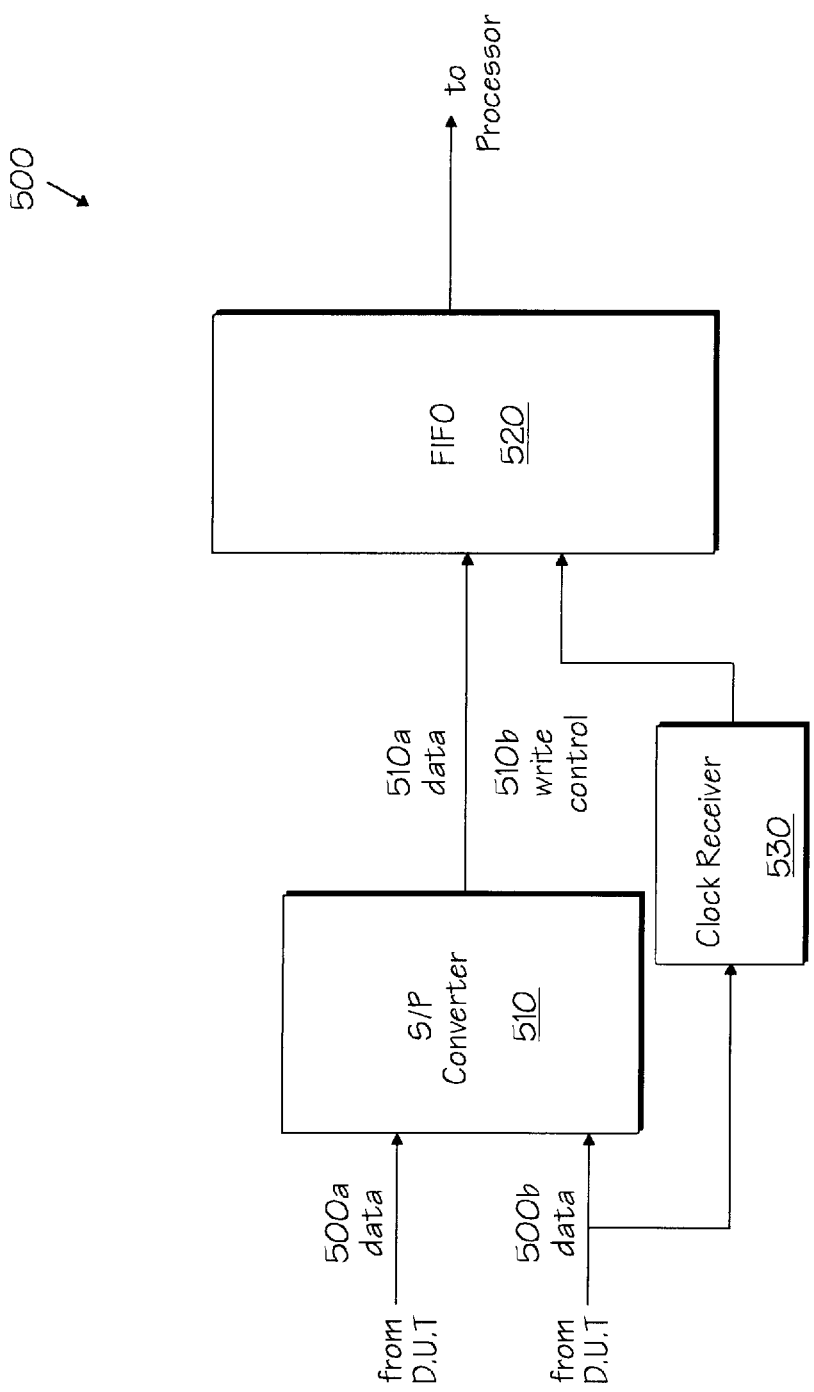
FIG. 5 illustrates a third embodiment of the digital tester module.

FIG. 5 illustrates another embodiment of the digital tester module 500. The digital tester module 500 receives a serial stream of output test data from the device under test over line 500a and a clock signal from the device under test over line 500b. The serial stream of output test data and the clock signal are received by the serial-to-parallel converter 510 in response to the clock signal from the device under test. The serial-to-parallel converter converts the serial stream of output test data into N-bit parallel output test data. The clock signal received from the device under test over line 500*b* is also received by the clock receiver 530. The clock receiver 530 generates a write control signal, having a frequency that is N times slower than the frequency of the clock signal 500*b*, to control the writing of the parallel output test data from the serial-to-parallel converter 510 into the FIFO memory device 520. The FIFO memory device 520 receives the write control signal over write control line 510*b*. If each memory location in the FIFO 520 stores 10 bits of parallel output data (also referred to as a word), then the clock receiver 530 generates a write control signal for every 10 bits of data shifted into the serial-to-parallel converter 510. The output test data stored in the FIFO 520 is accessed by a processor to evaluate the functionality of the device under test.

Figure 6:
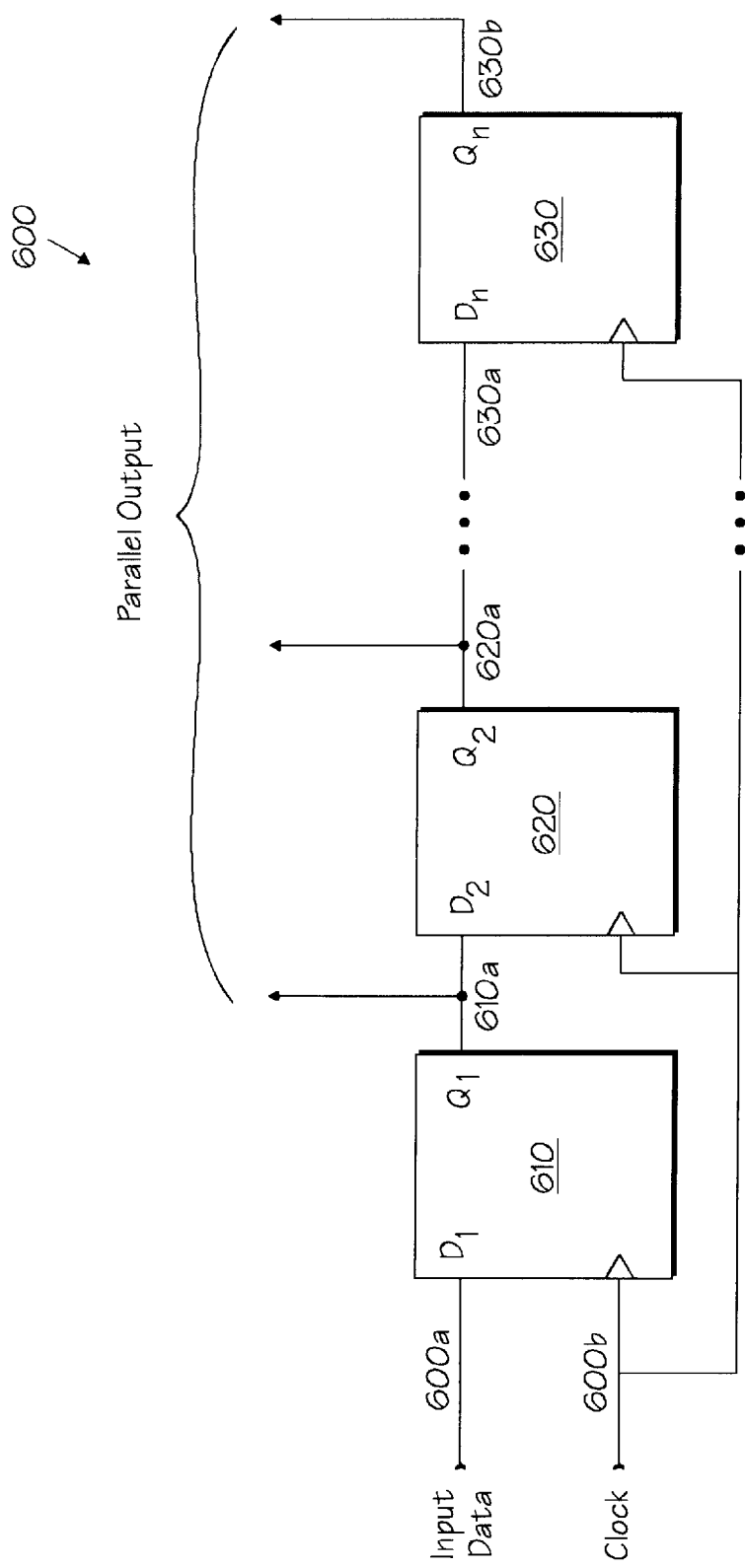
FIG. 6 illustrates a serial-to-parallel converter.

FIG. 6 illustrates an embodiment of the serial-to-parallel converter 600. The serial-to-parallel converter 600 includes a plurality of clocked data storage elements coupled in a serial order. In FIG. 6 the clock storage elements are D-flip-flops such that the D-flip-flop 610 receives input data over line 600*a* from the device under test and outputs data onto line 610*a* in response to the clock signal received in D-flip-flop 610 over line 600*b*. The clock signals received by the D-flip-flops 610, 620 and 630 are bit-rate clock signals. Furthermore, the data received by the D-flip-flop 620 over the line 610*a* is clocked into the D-flip-flop 620 in response to the clock signal over line 600*b* and the D-flip-flop 620 outputs data onto line 620*a*. The D-flip-flop 630 is the last flip-flop in the serial-to-parallel converter and receives input data over line 630*a* and outputs data over output line 630*b* in response to clock signal over 600*b*. If the serial-to-parallel converter 600 includes 10 D-flip-flops, it operates as a 10 bit shifter such that on the first clock cycle input data is shifted into D-flip-flop 610 over data line 600*a* and on the second clock cycle data is shifted into D-flip-flop 620 over line 610*a* and on the 10th clock signal data is shifted into D-flip-flop 630. Once data has been shifted into one of the D-flip-flops, it is available at the output of the D flip-flop such that each data bit stored in one of the flip-flops is shifted out of the serial-to-parallel converter 600.

Thus, A HIGH SPEED ASYNCHRONOUS DIGITAL TESTING MODULE has been described. In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A digital tester module comprising:

a phase locked-loop adapted to be coupled to a device under test, said phase locked-loop configured to receive a serial stream of output test data from said device under test and to generate a first clock signal and a second clock signal, in response thereto, said first clock signal having a frequency representing the rate at which said serial stream of output test data is received from said device under test and said second clock signal having a frequency representing a fraction of said frequency of said first clock signal, wherein said phase locked-loop is configured to generate said first and second clock signals independent of whether said serial stream of output test data is synchronous or asynchronous;

a serial-to-parallel converter coupled to receive said first clock signal and to receive said serial stream of output test data by clocking in said serial stream of output test data in response to said first clock signal and configured to convert said serial stream of output test data into parallel output test data; and an output memory device coupled to receive said second clock signal and to receive said parallel output test data in response to said second clock signal.

2. The apparatus of claim 1, wherein said serial-to-parallel converter comprises n clocked storage elements coupled in a serial order such that an input of a first of said n clocked storage elements is configured to receive said serial stream of output test data from said device under test and an output of said first clocked storage element is coupled to an input of a second of said n clocked storage elements and an input of an nth of said clocked storage elements is coupled to an output of an (n−1)th of said clocked storage elements.

3. The apparatus of claim 2, wherein each of said clocked storage elements is a D flip-flop.

4. The apparatus of claim 1, wherein said output memory device is a first-in-first-out memory device.

5. The apparatus of claim 4, wherein said output memory device is a first-in-first-out memory device.

6. The apparatus of claim 1 further comprises an input memory device adapted to be coupled to said device under test, said input memory device configured to store input test data for said device under test, wherein said input test data includes a plurality of input test vectors.

7. The apparatus of claim 6, wherein said parallel output test data includes a plurality of output test vectors each having a corresponding input test vector.

8. The apparatus of claim 7, wherein said output memory device is further configured to receive a plurality of marker groups each specifying the beginning of a sequence of said output test vectors.

9. The apparatus of claim 6, wherein said input memory device is a first-in-first-out memory device.

10. The apparatus of claim 6 further comprising an input memory device adapted to be coupled to said device under test and to store input test data for said device under test, said input test data including a plurality of input test vectors.

11. The apparatus of claim 10, wherein said parallel output data includes a plurality of output test vectors each having a corresponding input test vector.

12. The apparatus of claim 11, wherein said output memory device is further configured to receive a plurality of marker groups each specifying the beginning of a sequence of said output test vectors.

13. The apparatus of claim 10, wherein said input memory device is a first-in-first-out memory device.

14. The apparatus of claim 1, wherein said digital tester module further comprises a second output memory device coupled to said output memory device.

15. The apparatus of claim 14, wherein said second output memory devices is a dynamic random access memory (DRAM).

16. A digital tester module comprising:

a phase locked-loop configured to receive a serial stream of output test data from a device under test and to generate a first clock signal and a second clock signal in response thereto, wherein said phase locked-loop is configured to generate said first and second clock signals independent of whether said serial stream of output test data is synchronous or asynchronous;

a serial-to-parallel converter coupled to receive said first clock signal and said serial stream of output test data such that each bit of data from said serial stream of output test data is shifted into said serial-to-parallel converter in response to said first clock signal, said serial-to-parallel converter further configured to generate parallel output test data; and a first-in-first-out memory device coupled to receive said second clock signal and said parallel output test data such that each word of said parallel output test data is received by said first-in-first-out memory device in response to said second clock signal.

17. The apparatus of claim 16, wherein said first clock signal has a frequency representing the rate at which said serial stream of output test data is received from said device under test and said second clock signal has a frequency representing a fraction of said frequency of said first clock signal.

18. The apparatus of claim 11 wherein said serial-to-parallel converter comprises n clocked storage elements coupled in a serial order such that an input of a first of said clocked storage elements is configured to receive said serial stream of output test and an output of said first clocked storage element is coupled to an input of a second of said clocked storage elements and an input of an nth of said clocked storage elements is coupled to an output of an (n−1)th of said clocked storage elements.

19. The apparatus of claim 18, wherein each of said clocked storage elements is a D flip-flop.

20. The apparatus of claim 16 further comprising an input memory device configured to be coupled to said device under test and to store input test data for said device under test, said input test data including a plurality of test vectors.

21. The apparatus of claim 20, wherein said output test data includes a plurality of output test vectors each of said output test vectors having a corresponding input test vector.

22. The apparatus of claim 21, wherein said output memory device is further configured to receive a plurality of marker groups each specifying the beginning of a sequence of said output test vectors.

23. The apparatus of claim 20, wherein said input memory device is a first-in-first-out memory device.

24. The apparatus of claim 16, wherein said digital tester module further comprises an output memory device coupled to said first-in-first-out memory device.

25. The apparatus of claim 24, wherein said output memory device is a dynamic random access memory (DRAM).

26. A high speed digital tester comprising:
a processor configured to generate input test data for a device under test;
a digital tester module adaptable to be coupled to said device under test and to said processor, said digital tester module configured to receive output test data from said device under test at a first frequency and to store said output test data at a second frequency slower than said first frequency, wherein said digital tester module is configured to operate on said output test data independent of whether said output test data is synchronous or asynchronous;
a phase locked-loop configured to receive said output test data and to generate a first clock signal and a second clock signal in response thereto;
a serial-to-parallel converter coupled to receive said first clock signal and said output test data such that each bit of data from said output test data is shifted into said serial-to-parallel converter in response to said first clock signal, said serial-to-parallel converter further configured to generate parallel output test data; and a first-in-first-out memory device coupled to receive said second clock signal and said parallel output test data such that each word of said parallel output test data is received by said first-in-first-out memory device in response to said second clock signal.

27. The high speed digital tester of claim 26, wherein said processor is a conventional digital tester such as an integrated circuit device tester, a system tester, a logic analyzer or a circuit emulator.

28. The high speed digital tester of claim 26, wherein said processor is a computer system.

29. The apparatus of claim 26, wherein said output memory device is a First-In-First-Out memory device.

30. The apparatus of claim 26, wherein said serial-to-parallel converter comprises n clocked storage elements coupled in a serial order such that a first of said clocked storage elements is configured to receive said output test data and an output of said first clocked storage element is coupled to an input of a second of said clocked storage elements and an input of an nth of said clocked storage elements is coupled to an output of an (n−1)th of said clocked storage elements.

31. The apparatus of claim 30, wherein each of said clocked storage elements is a D flip-flop.

32. The apparatus of claim 30 further comprising an input memory device configured to be coupled to said device under test and to store input test data comprising a plurality of test vectors.

33. The apparatus of claim 32, wherein said input memory device is a First-In-First-Out memory device.

34. The apparatus of claim 32, wherein said digital tester module further comprises a second output memory device coupled to said output memory device.

35. The apparatus of claim 34, wherein said second output memory device is a dynamic random access memory (DRAM).

36. The apparatus of claim 30, wherein said parallel output test data includes a plurality of output test vectors each having a corresponding input test vector.

37. The apparatus of claim 36, wherein said output memory device is further configured to receive a plurality of marker groups each specifying the beginning of a sequence of said output test vectors.

38. A digital tester module comprising:
a serial-to-parallel converter adaptable to be coupled to receive a first clock signal from a device under test and to receive serial stream of output data from said device under test and configured to convert said serial stream of output test data into parallel output data, independent of whether said output test data is synchronous or asynchronous;
a clock receiver adaptable to be coupled to receive said first clock signal from said device under test and to generate a second clock signal having a frequency that is slower than the frequency of said first clock signal;
an output memory device coupled to said clock receive to receive said second clock signal and receive said parallel output data in response to said second clock signal.

39. The apparatus of claim 38, wherein said serial-to-parallel converter comprises n clocked storage elements coupled in a serial order such that an input of a first of said clocked storage elements is configured to receive said serial stream of output data from said device under test and an output of said first clocked storage element is coupled to an input of a second of said clocked storage elements and an input of an nth of said clocked storage elements is coupled to an output of an (n−1)th of said clocked storage elements.

40. The apparatus of claim 36, wherein each of said clocked storage elements is a D flip-flop.

41. The apparatus of claim 38, wherein said digital tester module further comprises a second output memory device coupled to said output memory device.

42. The apparatus of claim 41, wherein said second output memory devices is a dynamic random access memory (DRAM).

* * * * *